United States Patent
Brittles

(10) Patent No.: US 10,840,616 B2
(45) Date of Patent: Nov. 17, 2020

(54) SUPERCONDUCTING JOINT USING EXFOLIATED REBCO

(71) Applicant: Tokamak Energy Ltd., Oxfordshire (GB)

(72) Inventor: Greg Brittles, Abingdon (GB)

(73) Assignee: Tokamak Energy Ltd., Oxfordshire (GB)

( * ) Notice: Subject to any disclaimer, the term of this patent is extended or adjusted under 35 U.S.C. 154(b) by 0 days.

(21) Appl. No.: 16/641,512

(22) PCT Filed: Aug. 20, 2018

(86) PCT No.: PCT/GB2018/052359
§ 371 (c)(1),
(2) Date: May 22, 2020

(87) PCT Pub. No.: WO2019/038528
PCT Pub. Date: Feb. 28, 2019

(65) Prior Publication Data
US 2020/0194909 A1    Jun. 18, 2020

(30) Foreign Application Priority Data

Aug. 25, 2017 (GB) .................................. 1713683.9

(51) Int. Cl.
*H01R 4/68* (2006.01)
*H01L 39/12* (2006.01)
(Continued)

(52) U.S. Cl.
CPC ............. *H01R 4/68* (2013.01); *H01L 39/128* (2013.01); *H01L 39/24* (2013.01); *H01R 43/16* (2013.01)

(58) Field of Classification Search
CPC .......... H01R 4/68; H01R 43/16; H01R 39/02; H01L 39/128; H01L 39/24; H01F 6/06; H01F 41/048
(Continued)

(56) References Cited

U.S. PATENT DOCUMENTS

| | | | | |
|---|---|---|---|---|
| 5,882,536 A | * | 3/1999 | Balachandran | H01L 39/02 156/158 |
| 2014/0296078 A1 | * | 10/2014 | Oh | H01L 39/2419 505/411 |

(Continued)

FOREIGN PATENT DOCUMENTS

| | | |
|---|---|---|
| EP | 0501394 A2 | 9/1992 |
| EP | 0545608 A2 | 6/1993 |

(Continued)

OTHER PUBLICATIONS

International Search Report with Written Opinion for related Application No. PCT/GB2018/052359 dated Nov. 19, 2018 (11 Pages).

(Continued)

*Primary Examiner* — Sherman Ng
(74) *Attorney, Agent, or Firm* — Michael Best & Friedrich LLP

(57) ABSTRACT

According to a first aspect of the present invention, there is provided a method of forming a superconducting joint between ReBCO tapes. Two or more ReBCO tapes are provided, each having an exposed ReBCO region. A bridge is provided, comprising an exposed ReBCO layer and an oxygen-permeable backing on the exposed ReBCO layer. Each exposed ReBCO region is bonded to the exposed ReBCO layer of the bridge by heating to a first temperature (T1) in an environment where the partial pressure of oxygen is sufficiently low that the melting point of the ReBCO ($T_R$) is less than the melting point of silver ($T_{Ag}$), the temperature (T1) being between the melting point of the ReBCO ($T_R$)

(Continued)

and the melting point of silver ($T_{Ag}$), ($T_R<T1<T_{Ag}$). The resulting joint is annealed at a second temperature (T2) which is less than the melting point of ReBCO ($T_R$) (T2<$T_R$), for a time (t), in an environment where the partial pressure of oxygen is sufficient to reoxygenate the ReBCO at the second temperature (T2).

18 Claims, 3 Drawing Sheets

(51) Int. Cl.
    *H01L 39/24* (2006.01)
    *H01R 43/16* (2006.01)

(58) Field of Classification Search
    USPC .................................................... 174/125.1
    See application file for complete search history.

(56) References Cited

U.S. PATENT DOCUMENTS

| | | | | |
|---|---|---|---|---|
| 2015/0045229 A1* | 2/2015 | Mitsuhashi | ............ | H01B 12/02 505/230 |
| 2015/0357089 A1* | 12/2015 | Oh | ........................ | H01L 39/24 505/237 |
| 2016/0247607 A1* | 8/2016 | Oh | ........................ | B23K 20/233 |
| 2017/0011823 A1* | 1/2017 | Jin | ............................ | H01F 6/06 |
| 2017/0288323 A1* | 10/2017 | Sato | ........................ | H01F 6/06 |

FOREIGN PATENT DOCUMENTS

| | | |
|---|---|---|
| JP | H04269471 A | 9/1992 |
| JP | H05234626 A | 9/1993 |
| WO | 2008/118127 A1 | 10/2008 |

OTHER PUBLICATIONS

International Preliminary Report on Patentability for related Application No. PCT/GB2018/052359 dated Aug. 6, 2019 (9 Pages).

Search Report issued from the United Kingdom for related Application No. GB1713683.9 dated Feb. 20, 2018 (1 Page).

* cited by examiner

SUPERCONDUCTING JOINT USING EXFOLIATED REBCO

FIELD OF THE INVENTION

The present invention relates to the field of high temperature superconductors. In particular, the invention relates to methods of forming superconducting joints between ReBCO tapes, and superconducting current carriers comprising such joints.

BACKGROUND

Superconducting materials are typically divided into "high temperature superconductors" (HTS) and "low temperature superconductors" (LTS). LTS materials, such as Nb and NbTi, are metals or metal alloys whose superconductivity can be described by BCS theory. All low temperature superconductors have a critical temperature (the temperature above which the material cannot be superconducting even in zero magnetic field) below about 30K. The behaviour of HTS material is not described by BCS theory, and such materials may have critical temperatures above about 30K (though it should be noted that it is the physical differences in superconducting operation and composition, rather than the critical temperature, which define HTS material). The most commonly used HTS are "cuprate superconductors"—ceramics based on cuprates (compounds containing a copper oxide group), such as BSCCO ("bismuth strontium calcium copper oxide"), or ReBCO ("rare earth barium copper oxide", where Re is a rare earth element, commonly Y or Gd). Other HTS materials include iron pnictides (e.g. FeAs and FeSe) and magnesium diborate ($MgB_2$).

ReBCO is typically manufactured as tapes, with a structure as shown in FIG. 1. Such tape 500 is generally approximately 100 microns thick, and includes a substrate 501 (typically electropolished hastelloy approximately 50 microns thick), on which is deposited by IBAD, magnetron sputtering, or another suitable technique a series of buffer layers known as the buffer stack 502, of approximate thickness 0.2 microns. An epitaxial ReBCO-HTS layer 503 (deposited by MOCVD or another suitable technique) overlays 15 the buffer stack, and is typically 1 micron thick. A 1-2 micron silver layer 504 is deposited on the HTS layer by sputtering or another suitable technique, and a copper stabilizer layer 505 is deposited on the tape by electroplating or another suitable technique, which often completely encapsulates the tape.

The substrate 501 provides a mechanical backbone that can be fed through the manufacturing line and permit growth of subsequent layers. The buffer stack 502 is required to provide a biaxially textured crystalline template upon which to grow the HTS layer, and prevents chemical diffusion of elements from the substrate to the HTS which damage its superconducting properties. The silver layer 504 is required to provide a low resistance interface from the REBCO to the stabiliser layer, and the stabiliser layer 505 provides an alternative current path in the event that any part of the ReBCO ceases superconducting (enters the "normal" state).

Joints between ReBCO tapes are an important component of ReBCO systems. For "persistent mode" systems, where a closed loop of superconductor is used to carry a constant current and produce a quasi-permanent magnet, a joint is required in order to close the loop. For all ReBCO magnets, joints may be required due to the limited lengths of single tapes, or geometry requirements. The resistance of each joint adds to the total resistance of the magnet. For persistent mode operation, the resistance should be less than $5 \times 10^{-12}$ ohms, and for all joints lower resistances will result in greater efficiency and reduced cryogenic load. Low temperature superconductor joints can have resistances of $10^{-13}$ ohms or less through routine manufacturing techniques, but the chemical and structural requirements of ReBCO joints mean that such low resistances are much more difficult to obtain.

FIGS. 2a to 2c illustrate various join types of superconducting tapes or wires. Joints may be "butt joints" (FIG. 2a), where the two superconducting elements 211, 212 are placed end-to-end, "lap joints" (FIG. 2b), where the two superconducting elements 221, 222 are overlapped on top of one another, or "indirect joints" (FIG. 2c), where the two superconducting elements 231, 232 are connected via an intermediate superconducting element or 233 (e.g. solder, powder, or tape "bridge" pieces). Hybrid lap/butt joints may be made using "scarf" configurations where each conductor is polished to a shallow angle, or "step" configurations where each conductor is polished into a series of serrated steps, with the polished areas being brought into contact in each case.

An overview of the state of the art in superconducting joints is presented in Brittles, G., Mousavi, T., Grovenor, C., Aksoy, C. and Speller, S. (2015). *Persistent current joints between technological superconductors. Superconductor Science and Technology*, 28(9), p. 093001.

The difficulty in making superconducting ReBCO joints comes mainly from two factors. Firstly, ReBCO does not have a particularly high affinity for oxygen, and will readily give it up to other materials. This is the reason the silver layer 504 is required on the ReBCO tape. Any low temperature superconductor would strip the oxygen from the ReBCO, resulting in a non-superconducting region at the joint. Therefore, any ReBCO joint must be HTS-HTS. However, at the temperatures required to melt or enable atomic diffusion in ReBCO sufficiently for a bond to be made (i.e. above the "minimum joining temperature"), oxygen will diffuse out of the crystal at oxygen partial pressures of oxygen ($PO_2$) at or below atmospheric (and even higher $PO_2$ at higher temperatures).

Secondly, the melting point of the ReBCO varies with $\log(PO_2)$ (Taïr F et al (2017), *Melting temperature of YBaCuO and GdBaCuO at subatmospheric partial pressure, Journal of Alloys and Compounds*, Volume 692, p 787-792). At $PO_2$ similar or greater than atmospheric, the melting point of ReBCO is greater than that of the protective silver layer. This causes the silver layer to melt and diffuse into the ReBCO layer if a bond is attempted at high $PO_2$, causing a breakdown of the ReBCO layer before a joint can be formed.

Methods have been found which allow a superconducting ReBCO-ReBCO joint despite the above problems (Park, Y., Lee, M., Ann, H., Choi, Y. and Lee, H. (2014). *A superconducting joint for GdBa2Cu3O7-δ-coated conductors*. NPG Asia Materials, 6(5), p. e98). The ReBCO tapes to be joined are stripped of its silver layer by chemically dissolving it, and placed in face-to-face contact in a lap joint configuration. The joint is uniaxially pressed at a pressure of approx. 10 MPa in an environment with a $PO_2$ less than $10^{-2}$ Torr, causing the melting temperature of the ReBCO to be lower than that of silver. A heat treatment at 850° C. is applied to the tapes for a short time (~1 minute) to allow the ReBCO layers to fuse.

At this stage, the ReBCO at the joint would be depleted of oxygen and thus be non-superconducting under operating conditions, meaning that the joint would be resistive. To overcome this, the joint is annealed in a high-oxygen environment ($PO_2 = 5 \times 10^3$ Torr at 500° C.). However, oxygen diffusion to the ReBCO is limited by the substrate and buffer layers. This can be mitigated by laser drilling of the ReBCO tapes with a series of 20 micron holes prior to joining, but even with this step the annealing takes a very long time, approximately 350 hours.

The annealing step must take place below the orthorhombic to tetragonal phase transition temperature of ReBCO, which is 530° C. to 580° C. for YBCO (depending on $PO_2$). It is typically performed at 500° C.

An alternative method is to grow an intermediate ReBCO film or bulk in-situ during the jointing process, (optionally having a lower melting point than the ReBCO in the tapes to be joined), to form a bridge between the two tapes. This is done by placing a compacted ReBCO powder or a powder/binder slurry across the tapes. While this will form a ReBCO layer, the ReBCO layer formed in situ during jointing will not be textured or have the necessary microstructural features present in exfoliated REBCO, and so will have a lower current density.

SUMMARY

According to a first aspect of the present invention, there is provided a method of forming a superconducting joint between ReBCO tapes. Two or more ReBCO tapes are provided, each having an exposed ReBCO region. A bridge is provided, comprising an exposed ReBCO layer and an oxygen-permeable backing on the exposed ReBCO layer. Each exposed ReBCO region is bonded to the exposed ReBCO layer of the bridge by heating to a first temperature (T1) in an environment where the partial pressure of oxygen is sufficiently low that the minimum joining temperature of the ReBCO ($T_J$) is less than the melting point of silver ($T_{Ag}$), the temperature (T1) being between the minimum joining temperature of the ReBCO ($T_J$) and the melting point of silver ($T_{Ag}$), ($T_J<T1<T_{Ag}$). The resulting joint is annealed at a second temperature (T2) which is less than the orthorhombic to tetragonal phase transition temperature of ReBCO ($T_R$) (T2<$T_R$), for a time (t), in an environment where the partial pressure of oxygen is sufficient to reoxygenate the ReBCO at the second temperature (T2).

According to a second aspect, there is provided a method of forming a superconducting joint between ReBCO tapes. At least one of the ReBCO tapes is an exfoliated ReBCO tape comprising a ReBCO layer bonded to respective silver layers on each side of the ReBCO layer. The silver layer is chemically removed from the region to be joined on each ReBCO tape in order to produce an exposed ReBCO region on each tape. The exposed ReBCO regions are bonded to each other by heating to a first temperature (T1) in an environment where the partial pressure of oxygen is sufficiently low that the minimum joining temperature of the ReBCO ($T_J$) is less than the melting point of silver ($T_{Ag}$), the temperature (T1) being between the minimum joining temperature of the ReBCO ($T_J$) and the melting point of silver ($T_{Ag}$), ($T_J<T1<T_{Ag}$). The resulting joint is annealed at a second temperature (T2) which is less than the orthorhombic to tetragonal phase transition temperature of ReBCO ($T_R$) (T2<$T_R$), for a time (t), in an environment where the partial pressure of oxygen is sufficient to reoxygenate the ReBCO at the second temperature (T2).

According to a third aspect, there is provided a superconducting current carrier comprising two ReBCO tapes connected by a joint comprising a bridge comprising an exposed ReBCO layer and an oxygen-permeable backing on the exposed ReBCO layer, wherein the exposed ReBCO layer is bonded to a ReBCO layer of each of the tapes.

According to a fourth aspect, there is provided a superconducting current carrier comprising two ReBCO tapes connected by a joint, wherein at least one of the ReBCO tapes is an exfoliated ReBCO tape comprising a ReBCO layer bonded to respective silver layers on each side of the ReBCO layer, and wherein the ReBCO layers of each tape are bonded at the joint.

According to a fifth aspect, there is provided field coil comprising a superconducting current carrier according to the fourth or fifth aspect.

DETAILED DESCRIPTION

Figure 1:
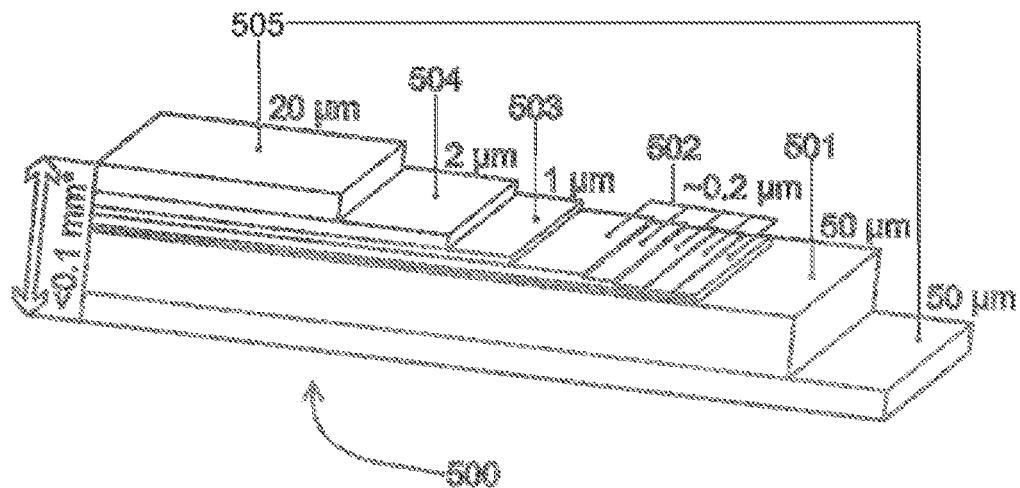
FIG. 1 is a schematic illustration of a ReBCO tape.
Figure 2A:
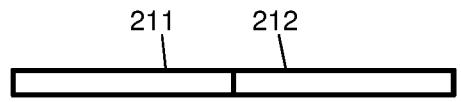
FIGS. 2a to 2c are schematic illustrations of joints between ReBCO tapes.
Figure 2B:
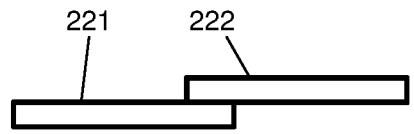
Figure 2C:
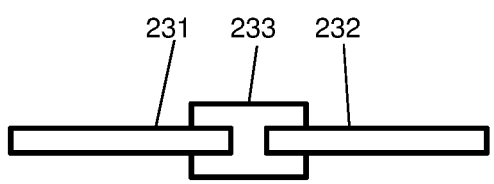
Figure 3:
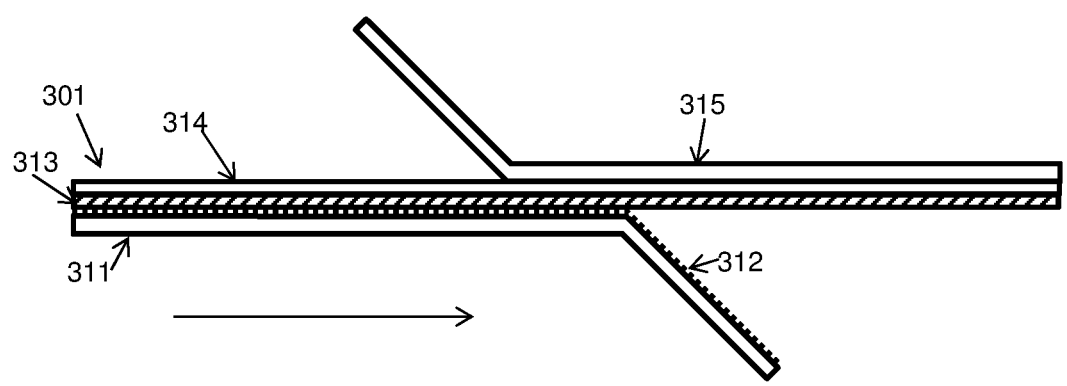
FIG. 3 is a schematic illustration of a process of exfoliating ReBCO tape.

Recent advances in the manufacture of ReBCO tapes have allowed long sections of ReBCO to be "exfoliated"—i.e. removed intact from the substrate layer. This process is illustrated in FIG. 3. A ReBCO tape 301 (shown here comprising a substrate 311, buffer stack 312, ReBCO layer 313 and silver layer 314, i.e. without the stabiliser layer) is fed into the process, and the substrate 311 and buffer stack 312 are peeled away to leave the "exfoliated" ReBCO layer 313 and silver 314 layers. A backing lamination 315 is applied to the silver layer to support the exfoliated ReBCO during the process. The backing lamination 315 may be removed after exfoliation. However, the backing lamination 315 improves the structural properties of the exfoliated ReBCO, as the silver layer is unlikely to be sufficiently mechanically robust for many applications. As the ReBCO layer 313 has come from a ReBCO tape, it will be fully textured and have similar superconducting properties to the original tape.

If the exfoliated ReBCO were to be used as a standard current carrying tape, a second silver layer would be applied to the exposed ReBCO face, and the tape would be encapsulated in a stabiliser layer to form an exfoliated HTS tape. However, the exfoliated ReBCO with a single silver layer can be used to make an improved ReBCO-ReBCO joint. The silver layer 314 is permeable to oxygen, and the backing lamination 315 can be made from an oxygen permeable material such as silver (as it does not have the same structural constraints as the substrate 311). Therefore, if the exfoliated ReBCO is used in a ReBCO-ReBCO joint, then oxygen diffusion to the ReBCO will be significantly faster than for a joint between two "substrated" HTS tapes (i.e. ReBCO tapes with the substrate still attached). If the exfoliated ReBCO is to be used in one or more exfoliated tapes which are being joined, then the second silver layer and stabiliser layer may be applied to the tape, excluding the regions to be joined, in order to remove the need for the step of chemically removing the silver layer. An exfoliated tape is structurally different to a conventional ReBCO tape in that an exfoliated HTS tape comprises a ReBCO layer with a silver layer on each face, whereas a conventional HTS tape comprises a ReBCO layer with a silver layer on one face and an oxide buffer stack on the other face (which connects to the substrate).

Figure 4:
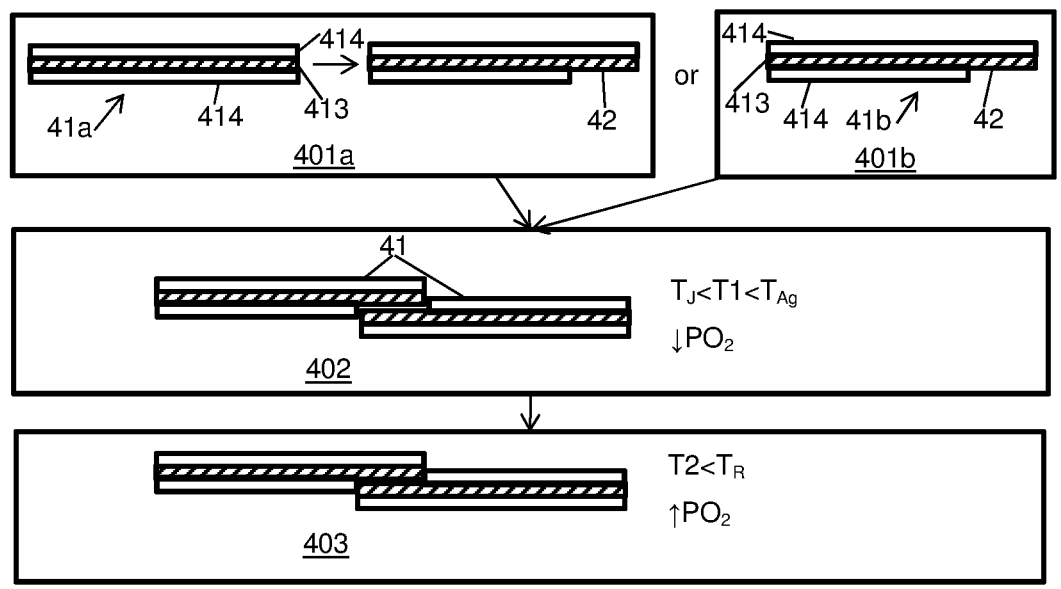
FIG. 4 is a schematic illustration of a process of forming a joint between ReBCO tapes.

This can be achieved as a joint between two exfoliated HTS tapes, each comprising a ReBCO layer 413 and two silver layers 414, as shown in FIG. 4, i.e:

Step 401: The silver layer is chemically removed from one side of the exfoliated HTS tapes 41*a* in the region to be joined (401*a*), or exfoliated HTS tapes 41*b* are provided with an incomplete silver layer on one side (401*b*), leaving the ReBCO in the region to be joined 42 exposed;

Step 402: The exposed ReBCO regions 42 are brought into contact and heat treated in a low-oxygen environment ($PO_2$<approx. 200 Torr) at a temperature T above the minimum joining temperature of the ReBCO $T_R$ (approx 800° C. at $PO_2$=0.01 Torr) but below the melting point of silver $T_{Ag}$ (961° C. at standard pressure);

Step 403: The joined HTS tapes are annealed in an oxygen-rich environment below the orthorhombic to tetragonal phase transition temperature (530° C. to 560° C. depending on $PO_2$) of the ReBCO to restore oxygen to the ReBCO.

Example temperatures given are for YBCO, and will be different for other rare earth elements.

The annealing step will be significantly faster than for substrated HTS tapes. The exact timings will depend on the temperature and $PO_2$ used, but times of less than 5 hours are achievable, and a process at 500° C. in pure oxygen at 1 atmosphere (760 Torr) will take approximately 1 hour. This is a considerable improvement over the 350 hours required by prior art methods.

A joint can be formed between an exfoliated HTS tape and a substrated HTS tape by a similar method.

As a further alternative, an indirect joint can be formed between any combination of exfoliated HTS tapes and substrated HTS tapes by using an exfoliated ReBCO with oxygen-permeable backing (i.e. just silver, or silver plus an oxygen permeable backing layer 315) as a "bridge" between the tapes to be joined.

Figure 5:
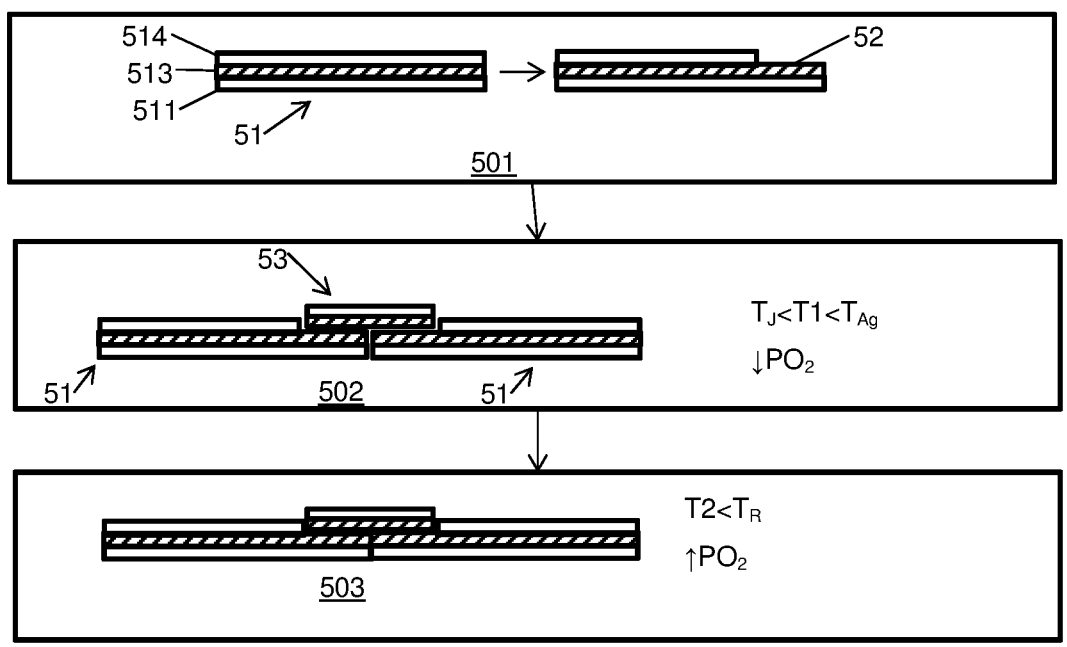
FIG. 5 is a schematic illustration of a process of forming an indirect joint between ReBCO tapes.

A method of forming an indirect joint between two substrated HTS tapes, each comprising a ReBCO layer 513, a silver layer 514, and a substrate 511 is shown in FIG. 5.

Step 501: The silver layer is chemically removed from the substrated HIS tapes 51 in the region to be joined, leaving the ReBCO in the region to be joined exposed 52.

Step 502: The ReBCO of the substrated HIS tapes 51 is brought into contact with the ReBCO of a section of exfoliated ReBCO with oxygen permeable backing 53, and the joint is heat treated in a low-oxygen environment ($PO_2$<approx. 200 Torr) at a temperature T above the minimum joining temperature of the ReBCO $T_R$ (approx 800° C. at $PO_2$<0.01 Torr) but below the melting point of silver $T_{Ag}$ (961° C.).

Step 503: The joint is annealed in an oxygen-rich environment below the orthorhombic to tetragonal phase transition temperature (530° C. to 560° C. depending on $PO_2$) of the ReBCO to restore oxygen to the ReBCO.

The exfoliated ReBCO with oxygen-permeable backing may be provided with a protective silver layer on the side to be joined (for storage and transport), in which case this can be removed in step 501.

The "oxygen-rich environment" in steps 403 and 503 is an environment with $PO_2$ sufficient to cause reoxygenation of the ReBCO, e.g. with $PO_2$ above atmospheric levels (0.21 atm=160 Torr) or with $PO_2$ greater than 1 atm (=720 Torr). The minimum $PO_2$ required will depend on the temperature used for the annealing step, with higher temperature requiring greater $PO_2$.

While the example of FIG. 5 shows just two tapes being joined in a linear configuration, it will be appreciated that multiple tapes may be joined in a variety of configurations.

The chemical removal of the silver layer in step 401*a* or 501 may be achieved by any suitable means which would remove the solver layer without affecting the ReBCO. For example, a $KI+I:H_2O$ solution can be used to dissolve the silver layer on tapes without a copper stabiliser. For tapes with a copper stabiliser, an $FeCl_3$ solution can be used to dissolve the copper, and then an $H_2O_2:NH_4OH$ solution to remove the silver chloride formed by that reaction as well as the remaining silver layer.

The invention claimed is:

1. A method of forming a superconducting joint between ReBCO tapes, the method comprising:
    providing two or more ReBCO tapes, each having an exposed ReBCO region;
    providing a bridge comprising a ReBCO layer directly bonded to a silver layer on one side of the ReBCO layer facing away from the two or more ReBCO tapes, and having exposed ReBCO on the other side of the ReBCO layer facing towards the two or more ReBCO tapes;
    bonding each exposed ReBCO region to the exposed ReBCO layer of the bridge by heating to a first temperature (T1) in an environment where the partial pressure of oxygen is sufficiently low that the minimum joining temperature of the ReBCO ($T_R$) is less than the melting point of silver ($T_{Ag}$), the temperature (T1) being between the minimum joining temperature of the ReBCO ($T_J$) and the melting point of silver ($T_{Ag}$), ($T_J$<T1<$T_{Ag}$);
    annealing the resulting joint at a second temperature (T2) which is less than the orthorhombic to tetragonal phase transition temperature of ReBCO ($T_R$) (T2<$T_R$), for a time (t), in an environment where the partial pressure of oxygen is sufficient to reoxygenate the ReBCO at the second temperature (T2).

2. A method according to claim 1, wherein the exposed ReBCO layer is a textured ReBCO layer.

3. A method according to claim 2, wherein providing the bridge comprises:
    providing a further ReBCO tape having a substrate, buffer stack, the ReBCO layer, and the silver layer;
    removing the substrate and buffer stack from the ReBCO tape.

4. A method according to claim 2, wherein providing the bridge comprises:
    providing a further ReBCO tape having the ReBCO layer, the silver layer, and a further silver layer on the opposite side of the ReBCO layer;
    removing the further silver layer from one side of the ReBCO layer.

5. A method according to claim 1, wherein providing the two or more ReBCO tapes, each having an exposed ReBCO region comprises, for at least one of the ReBCO tapes, chemically removing a silver layer from the ReBCO tape in order to form the exposed ReBCO region.

6. A method of forming a superconducting joint between ReBCO tapes, the method comprising:

providing a first ReBCO tape which is an exfoliated ReBCO tape comprising a ReBCO layer directly bonded to respective silver layers on each side of the ReBCO layer;

providing a second ReBCO tape comprising a ReBCO layer bonded to a silver layer on at least one side of the ReBCO layer;

chemically removing the silver layer from the region to be joined on each of the first and second ReBCO tape in order to produce an exposed ReBCO region on each tape;

bonding the exposed ReBCO regions to each other by heating to a first temperature (T1) in an environment where the partial pressure of oxygen is sufficiently low that the minimum joining temperature of the ReBCO ($T_J$) is less than the melting point of silver ($T_{Ag}$), the temperature (T1) being between the minimum joining temperature of the ReBCO ($T_J$) and the melting point of silver ($T_{Ag}$), ($T_J$<T1<$T_{Ag}$);

annealing the resulting joint at a second temperature (T2) which is less than the orthorhombic to tetragonal phase transition temperature of ReBCO ($T_R$) (T2<$T_R$), for a time (t), in an environment where the partial pressure of oxygen is sufficient to reoxygenate the ReBCO at the second temperature (T2).

7. A method according to claim 6, wherein the second ReBCO tape comprises a buffer stack and substrate on the side of the ReBCO layer opposite the silver layer.

8. A method according to claim 6, wherein the second ReBCO tape comprises a further silver layer on the other side of the ReBCO tape.

9. A method according to claim 6, wherein the time (t) is less than 5 hours.

10. A method according to claim 6, wherein the time (t) is less than 1 hour.

11. A method according to claim 6, wherein the oxygen-rich environment is a pure oxygen environment.

12. A superconducting current carrier comprising two ReBCO tapes connected by a joint comprising a bridge;

the bridge comprising a ReBCO layer directly bonded to a silver layer on one side of the ReBCO layer facing away from the two ReBCO tapes, and having exposed ReBCO on the other side of the ReBCO layer facing towards the two ReBCO tapes;

wherein the exposed ReBCO layer is bonded to a ReBCO layer of each of the ReBCO tapes.

13. A superconducting current carrier comprising two ReBCO tapes connected by a joint, wherein at least one of the ReBCO tapes is an exfoliated ReBCO tape comprising a ReBCO layer directly bonded to respective silver layers on each side of the ReBCO layer, and wherein the ReBCO layers of each tape are bonded at the joint.

14. A field coil comprising a superconducting current carrier according to claim 12.

15. A field coil comprising a superconducting current carrier according to claim 13.

16. A method according to claim 1, wherein the time (t) is less than 5 hours.

17. A method according to claim 1, wherein the time (t) is less than 1 hour.

18. A method according to claim 1, wherein the oxygen-rich environment is a pure oxygen environment.

* * * * *